(12) United States Patent
Lu et al.

(10) Patent No.: US 8,754,477 B2
(45) Date of Patent: Jun. 17, 2014

(54) SEMICONDUCTOR DEVICE WITH MULTIPLE STRESS STRUCTURES AND METHOD OF FORMING THE SAME

(75) Inventors: Wei-Yuan Lu, Taipei (TW); Li-Ping Huang, Taipei (TW); Han-Ting Tsai, Kaohshiung (TW); Wei-Ching Wang, Taichung (TW); Ming-Shuan Li, Hsinchu County (TW); Hsueh-Jen Yang, Taipei (TW); Kuan-Chung Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

(21) Appl. No.: 13/277,872

(22) Filed: Oct. 20, 2011

(65) Prior Publication Data
US 2013/0099314 A1    Apr. 25, 2013

(51) Int. Cl.
*H01L 27/12* (2006.01)
*H01L 21/336* (2006.01)

(52) U.S. Cl.
USPC .......................................... 257/347; 438/299

(58) Field of Classification Search
None
See application file for complete search history.

(56) References Cited

U.S. PATENT DOCUMENTS

| | | | |
|---|---|---|---|
| 5,079,180 A * | 1/1992 | Rodder et al. | 438/297 |
| 2003/0011037 A1 * | 1/2003 | Chau et al. | 257/412 |
| 2005/0205934 A1 * | 9/2005 | Lochtefeld et al. | 257/347 |
| 2008/0124858 A1 * | 5/2008 | Nguyen et al. | 438/217 |
| 2012/0164805 A1 * | 6/2012 | Kronholz et al. | 438/276 |

OTHER PUBLICATIONS

Wei, A.; Wiatr, M.; Mowry, A.; Gehring, A.; Boschke, R.; Scott, C.; Hoentschel, J.; Duenkel, S.; Gerhardt, M.; Feudel, T.; Lenski, M.; Wirbeleit, F.; Otterbach, R.; Callahan, R.; Koerner, G.; Krumm, N.; Greenlaw, D.; Raab, M.; Horstmann, M., "Multiple Stress Memorization In Advanced SOI CMOS Technologies," VLSI Technology, 2007 IEEE Symposium on.*

U.S. Appl. No. 13/177,309, filed Jul. 6, 2011, entitled "A Semiconductor Device with a Dislocation Structure and Method of Forming the Same," 24 pages of text, 16 pages of drawings.

* cited by examiner

*Primary Examiner* — Mark Tornow
*Assistant Examiner* — Priya Rampersaud
(74) *Attorney, Agent, or Firm* — Haynes and Boone, LLP

(57) ABSTRACT

A method of fabricating and a semiconductor device with multiple dislocation structures is disclosed. The exemplary semiconductor device includes gate structure overlying a top surface of a semiconductor substrate and a first gate spacer disposed on a sidewall of the gate structure and overlying the top surface of the substrate. The semiconductor device further includes a crystallized semiconductor material overlying the top surface of the semiconductor substrate and adjacent to a sidewall of the first gate spacer. The semiconductor device further includes a second gate spacer disposed on the sidewall of the first gate spacer and overlying the crystallized semiconductor material. The semiconductor device further includes a first stressor region disposed in the semiconductor substrate and a second stressor region disposed in the semiconductor substrate and in the crystallized semiconductor material.

20 Claims, 10 Drawing Sheets

US 8,754,477 B2

SEMICONDUCTOR DEVICE WITH MULTIPLE STRESS STRUCTURES AND METHOD OF FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
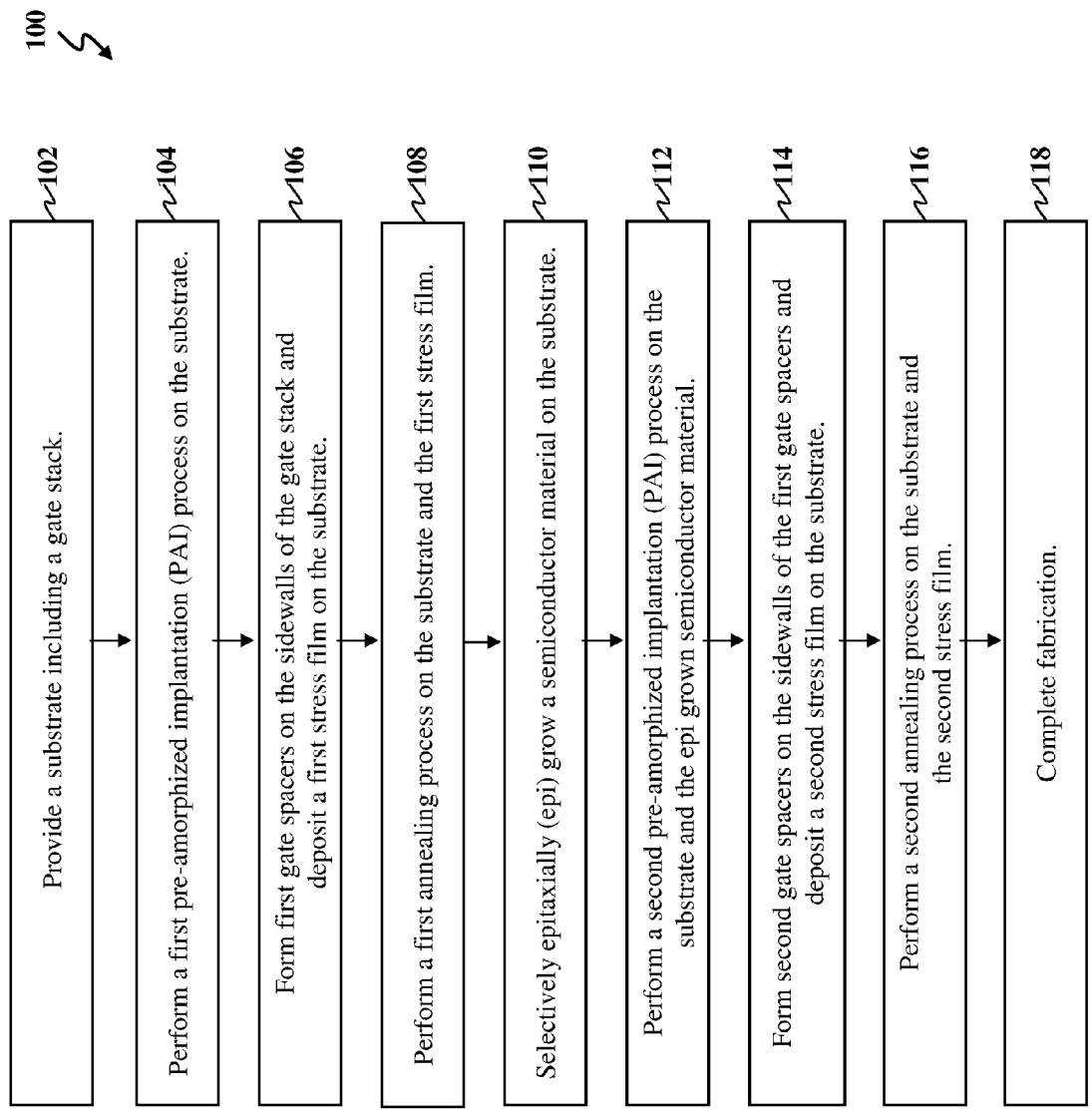
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

With reference to FIGS. 1 and 2 to 10, a method 100 and a semiconductor device 200 are collectively described below. The semiconductor device 200 illustrates an integrated circuit, or portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by MOS technology processing, and thus some processes are not described in detail herein. It is further understood that additional features can be added in the semiconductor device 200, and some of the features described below can be replaced or eliminated, for additional embodiments of the semiconductor device 200. The following disclosure will continue with a MOSFET example of a semiconductor device 200, to illustrate various embodiments of the present invention. It is understood, however, that the invention should not be limited to a particular type of device, except as specifically claimed.

Referring to FIG. 1, a method 100 for fabricating a semiconductor device is described according to various aspects of the present disclosure. The method 100 begins with step 102 in which a substrate is provided. The substrate includes a gate stack. The method 100 continues with step 104 in which a first pre-amorphous implantation (PAI) process is performed on the substrate. The method 100 continues at step 106 in which first gate spacers are formed on the sidewalls of the gate stack and a first stress film is deposited on the substrate. The method 100 continues at step 108 in which a first annealing process is performed on the substrate and the first stress film. After the first annealing process, the first stress film is removed. The method 100 continues at step 110 in which a semiconductor material is epitaxially (epi) grown on the substrate. The epi grown semiconductor material is grown in a source and drain region of the substrate. The method 100 continues at step 112 in which a second pre-amorphous implantation (PAI) process is performed on the substrate and the epi grown semiconductor material. The method 100 continues at step 114 in which second gate spacers are formed on sidewalls of the first gate spacers and a second stress film is deposited on the substrate. The method 100 continues at step 116 in which a second annealing process is performed on the substrate and the second stress film. The method 100 continues at step 118 in which fabrication is completed. Additional steps can be provided before, during, and after the method 100, and some of the steps described below can be replaced or eliminated, for additional embodiments of the method. The discussion that follows illustrates various embodiments of a semiconductor device 200 that can be fabricated according to the method 100 of FIG. 1.

Figure 2:
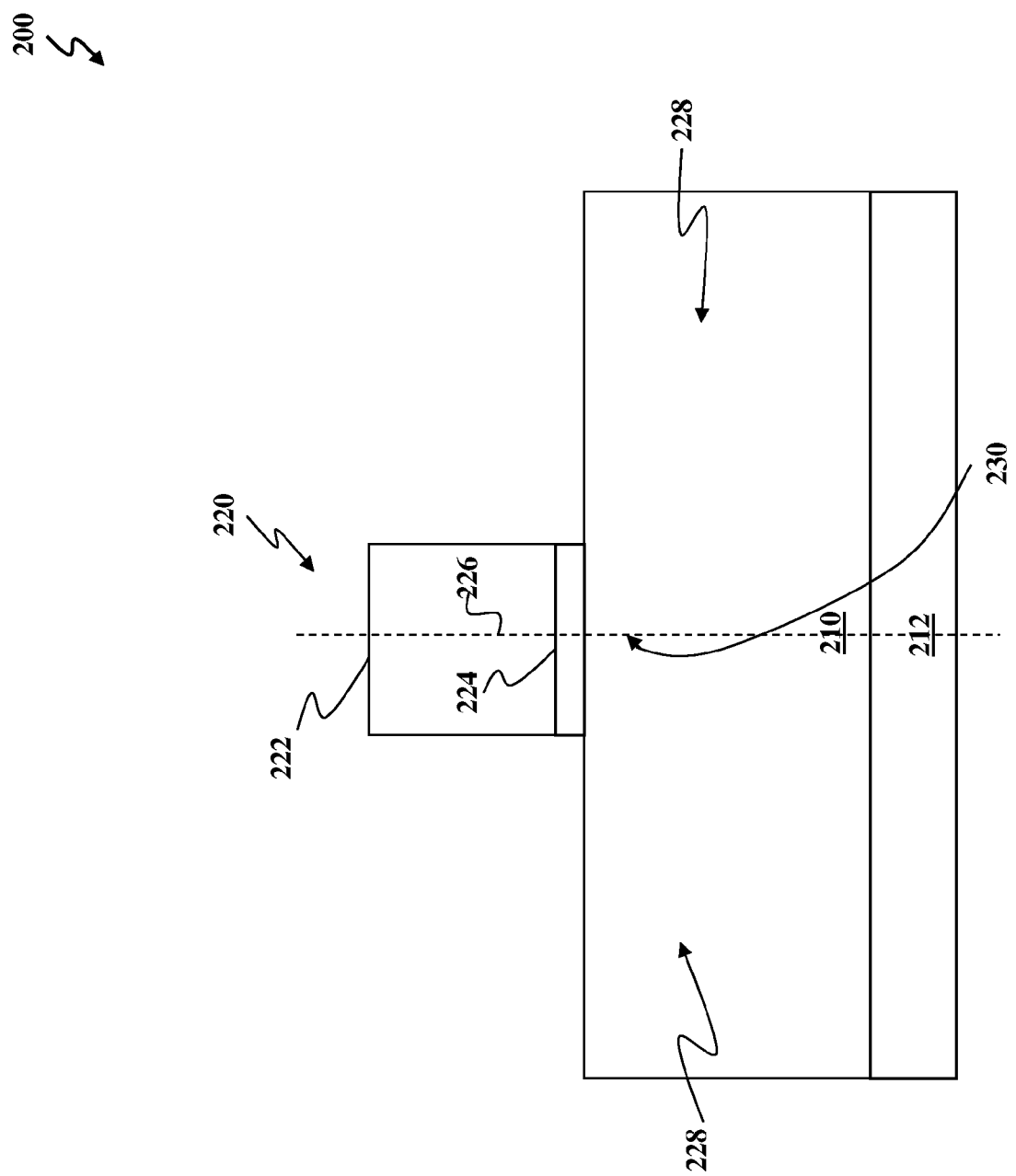
FIGS. 2 to 10 illustrate diagrammatic cross-sectional side views of one embodiment of a semiconductor device at various stages of fabrication according to the method of FIG. 1.

FIGS. 2 to 10 illustrate diagrammatic cross-sectional side views of one embodiment of a semiconductor device 200 at various stages of fabrication according to the method 100 of FIG. 1. Referring to FIG. 2, the semiconductor device 200 includes a substrate 210. In the present embodiment, the substrate 210 is an ultra-thin-body (UTB) semiconductor on insulator (SOI) substrate including silicon (Si). A UTB substrate, for example, may have a thickness (of the semiconductor material) from about 10 to about 30 nanometers. The SOI substrate can be fabricated using separation by implantation of oxygen (SIMOX), wafer bonding, and/or other suitable methods. The substrate 210 may include an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained.

The substrate 210 includes various doped regions depending on design requirements, (e.g., p-type wells or n-type wells). The doped regions are doped with p-type dopants, such as boron or BF2, and/or n-type dopants, such as phosphorus or arsenic. The doped regions may be formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

The substrate 210 can include an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 2, the substrate 210 includes an insulator layer 212. The insulator layer 212 may include, for example, a material such as silicon oxide, high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. The substrate 210 further includes a gate structure 220. The gate structure 220 includes various gate material layers. In the present embodiment, the gate structure 220 includes a gate stack 222 (also referred to as a gate electrode) and gate dielectric 224. The gate structure 220 has a center line 226 which dissects the gate structure 220 into two substantially equal halves. The gate structure 220 separates a source and drain (S/D) region 228 of the semiconductor device 200. The S/D region 228 define a channel region 230 therebetween.

The gate stack 222 is formed over the substrate 210 to a suitable thickness. In an example, the gate stack 222 is a polycrystalline silicon (or polysilicon) layer. The polysilicon layer may be doped for proper conductivity. Alternatively, the polysilicon is not necessarily doped, for example, if a dummy gate is to be formed and later replaced by a gate replacement process. In another example, the gate stack 222 is a conductive layer having a proper work function, therefore, the gate stack 222 can also be referred to as a work function layer. The work function layer includes a suitable material, such that the layer can be tuned to have a proper work function for enhanced performance of the device. For example, if a P-type work function metal (P-metal) for a PMOS device is desired, TiN or TaN may be used. On the other hand, if an N-type work function metal (N-metal) for an NMOS device is desired, Ta, TiAl, TiAlN, or TaCN, may be used. The work function layer could include doped conducting oxide materials. The gate stack 222 could include other conductive materials, such as aluminum, copper, tungsten, metal alloys, metal silicide, other suitable materials, and/or combinations thereof. The gate stack 222 could include multiple layers. For example, where the gate stack 222 includes a work function layer, another conductive layer can be formed over the work function layer. The gate stack 222 is formed by chemical vapor deposition (CVD), physical vapor deposition (PVD), atomic layer deposition (ALD), high density plasma CVD (HDPCVD), plating, other suitable methods, and/or combinations thereof.

Figure 3:
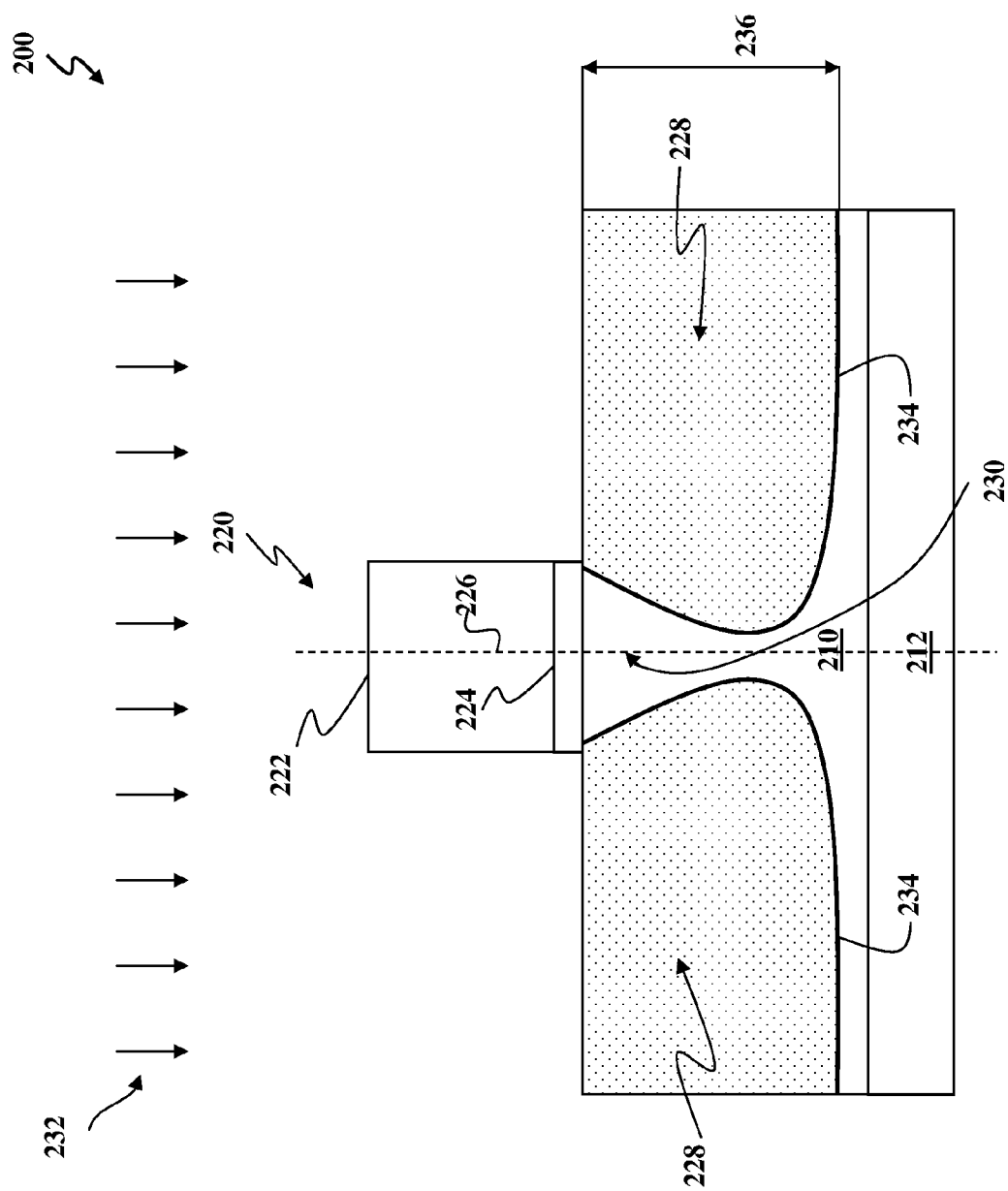

Referring to FIG. 3, a first pre-amorphous implantation (PAI) process 232 is performed on the substrate 210. The first PAI process 232 implants the substrate 210, damaging the lattice structure of the substrate 210 and forming a first amorphized region 234. In the present embodiment, the first amorphized region 234 is formed the S/D region 228 of the semiconductor device 200 and does not extend beyond the center line 226 of the gate structure 220. The first amorphized region 234 has a depth 236, which is a maximum depth, measured from the top surface of the substrate 210. The first amorphized depth 236 is formed according to design specifications. The first amorphized depth 236 may range from about 10 to about 150 nanometers. In the present embodiment, because the substrate 210 is a UTB SOI substrate, the first amorphized depth 236 is less than about 30 nanometers.

The first PAI process 232 can be tuned, for example, by controlling the implant angle, the implant energy, implant species, and/or implant dosage. The first PAI process 232 implants the substrate 210 with silicon (Si) or germanium (Ge). Alternatively, the first PAI process 232 could utilize other implant species, such as Ar, Xe, BF2, As, In, other suitable implant species, or combinations thereof. In the present embodiment, the first PAI process 232 implants Si or Ge at an implant energy from about 10 KeV to about 60 KeV, and a dosage ranging from about 1E14 atoms/cm2 to about 5E15 atoms/cm2, depending on the implantation temperature. Lower implantation temperature will enhance implant amorphization efficiency. The implantation temperature can be any temperature ranging from about −100° C. to about 30° C. For example, the implantation temperature can be room temperature ranging from about 20° C. to about 30° C., or the implantation temperature can be a cryogenic temperature ranging from about −100° C. to about −60° C. The implantation angle can range, for example, from about 0 degrees to about 20 degrees. The implantation angle is limited by the proximity of adjacent structures that may block/obstruct the first PAI process 232. The first PAI process 232 may include multiple implantation steps, depending on design specifications and the above noted tuning variables. For example, the first PAI process 232 may include a two step process wherein the first step includes utilizing an implantation energy from about 25 KeV to about 40 KeV and a dosage from about 1E14 atoms/cm2 to about 5E15 atoms/cm2, and the second step includes utilizing an implantation energy from about 10 KeV to about 40 KeV and a dosage from about 1E14 atoms/cm2 to about 5E15 atoms/cm2.

A patterned photoresist layer may be utilized to define where the first amorphized region 234 is formed and protect other regions of the semiconductor device 200 from implantation damage. For example, the patterned photoresist layer is patterned such that it exposes the S/D regions 228 to the first PAI process 232 (forming first amorphized region 234) while protecting the gate structure 220 (and other portions of the semiconductor device 200) from the first PAI process 232. Alternatively, a patterned hard mask layer, such as a SiN or SiON layer, is utilized to define the first amorphized region 234. The patterned photoresist layer or the patterned hard mask layer may be part of the current manufacturing process (e.g., LDD or source/drain formation), thereby minimizing cost as no additional photoresist layer or hard mask is required for the first PAI process 232.

Figure 4:
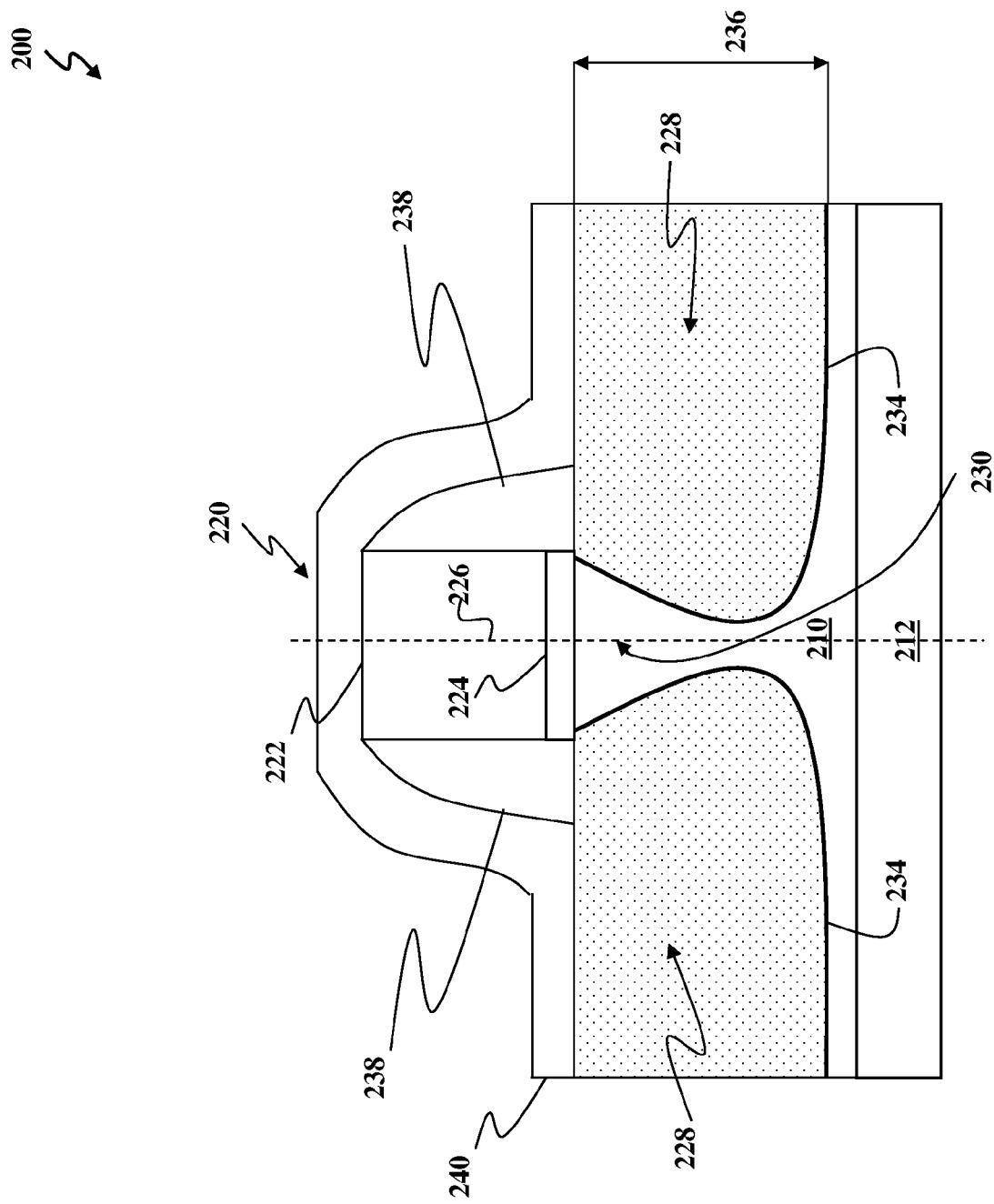

Referring to FIG. 4, first gate spacers 238 are formed on the sidewalls of the gate stack 222. The first gate spacers 238 are formed over the substrate 210 by any suitable process to any suitable thickness. The first gate spacers 238 include a dielectric material, such as silicon nitride, silicon oxide, silicon oxynitride, other suitable materials, and/or combinations thereof. The first gate spacers 238 can be used to offset subsequently formed doped regions, such as heavily doped source/drain regions. A first stress film 240 is deposited over the substrate 210. The first stress film 240 may be formed by chemical vapor deposition (CVD), physical vapor deposition (PVD), atomic layer deposition (ALD), high density plasma CVD (HDPCVD), plating, other suitable methods, and/or combinations thereof. The first stress film 240 may include a dielectric material, such as silicon nitride, silicon oxide, silicon oxynitride, other suitable materials, and/or combinations thereof. The first stress film 240 is used to provide stress in a subsequent first annealing process 242 which crystallizes the first amorphized region 234.

Figure 5:
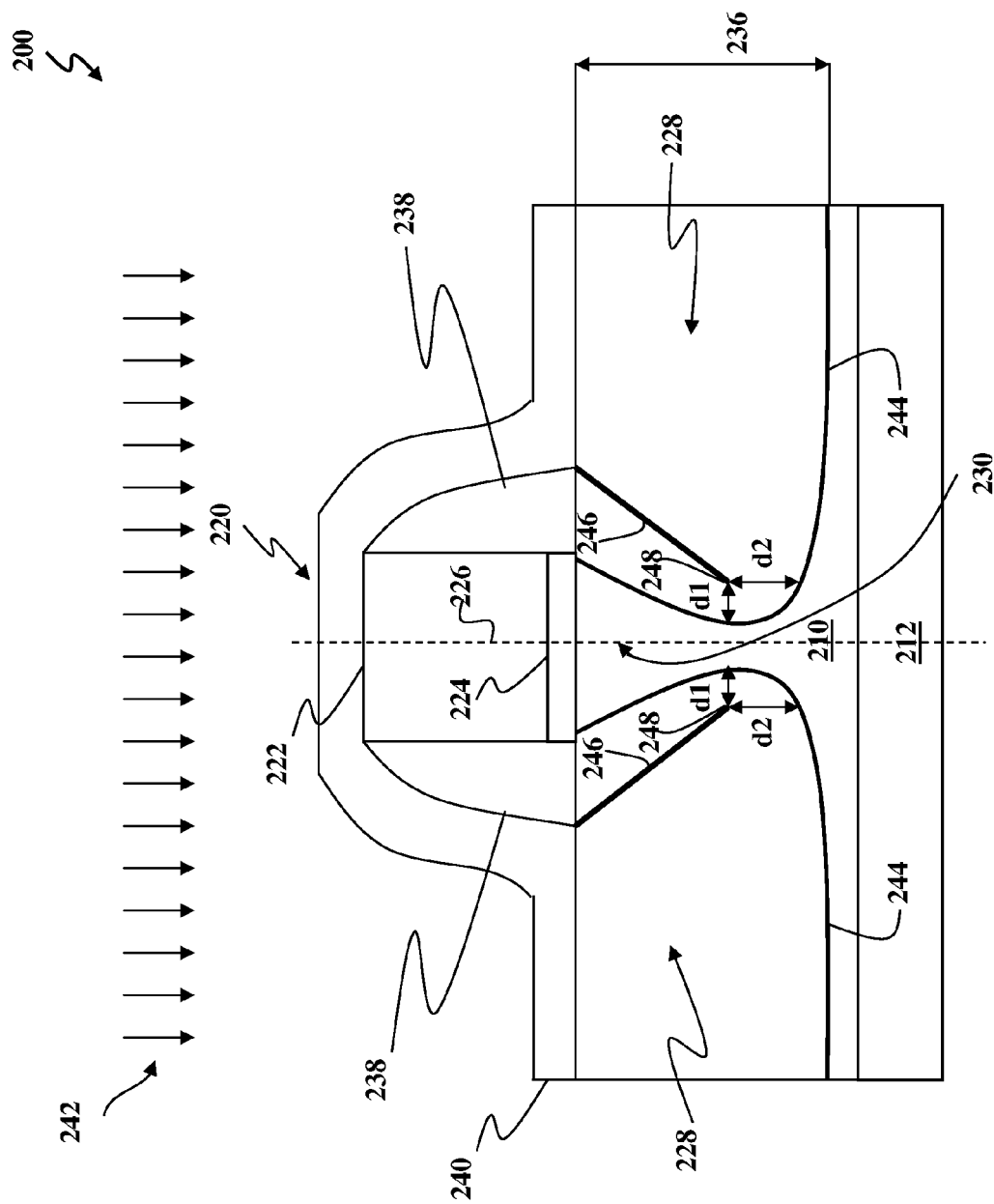

Referring to FIG. 5, a first annealing process 242 is performed on the substrate 210. The first annealing process 242 causes the first amorphized region 234 to crystallize, forming a first stressor region 244. This process is often referred to as solid-phase epitaxy (SPE), and thus, the first stressor region 244 may be referred to as epi regions. The first annealing process 242 is a rapid thermal annealing (RTA) process or a millisecond thermal annealing (MSA) process (for example, a millisecond laser thermal annealing process).

The first annealing process 242 may include a long range pre-heat which minimizes or even eliminates end of range (EOR) defects. The long range pre-heat may be performed at a temperature from about 500° C. to about 800° C. The long range pre-heat may be performed for about 10 to about 300 seconds. The first annealing process 242 may be performed at a temperature from about 500° C. to about 1,400° C. Also, depending on the type of annealing process and the temperature utilized, the first annealing process 242 may be performed for about 1 millisecond to about 300 seconds. In the present embodiment, the first annealing process 242 is a RTA process, utilizing a temperature greater from about 950° C. to about 1050° C. and is performed for about 3 milliseconds to about 5 seconds. In an embodiment, the first annealing process 242 is a MSA process, utilizing a temperature up to a Si melting point of about 1,400° C. and is performed for a few milliseconds or less, for example for about 0.8 milliseconds to about 100 milliseconds.

During the first annealing process 242, as the substrate 210 crystallizes, first dislocations 246 are formed in the first stressor region 244. The first dislocations 246 may be formed, for example, in the 111 direction. The 111 direction has an angle of about 45 to about 65 degrees, the angle being measured with respect to an axis parallel to the top surface of the substrate 210. In the present embodiment, the first dislocations 246 have a 111 direction with an angle of about 55 degrees, the angle being measured with respect to an axis parallel to the top surface of the substrate 210.

The first dislocations 246 start formation at first pinchoff points 248. In the present embodiment, the first pinchoff points 248 are formed in the first stressor region 244 at a depth of about 10 to about 30 nanometers, the depth being measured from the top surface of the substrate 210. The first pinchoff points 248 have a horizontal buffer d1 and a vertical buffer d2. The horizontal buffer d1 and the vertical buffer d2 are formed according to design specifications and are a function of the first annealing process 242. For example, the first pinchoff points 248 have a horizontal buffer d1 of about 1 to about 10 nanometers and a vertical buffer d2 of about 1 to about 20 nanometers. In furtherance of the example, the first pinchoff points 248 may be formed such that they are disposed from about −10 to about 10 nanometers from the gate edge in a horizontal direction. In other words, the first pinchoff points 248 may be formed such that they are disposed from about −10 to about 10 nanometers within or outside the channel region 230. In the present embodiment, the first pinchoff points 248 have a horizontal buffer d1 of about 5 nanometers, a vertical buffer d2 of about 5 nanometers, and are formed at a depth of less then about 30 nanometers (the depth being measured from the top surface of the substrate 210), and are formed such that they are disposed about 5 nanometers from the gate edge in a horizontal direction.

Figure 6:
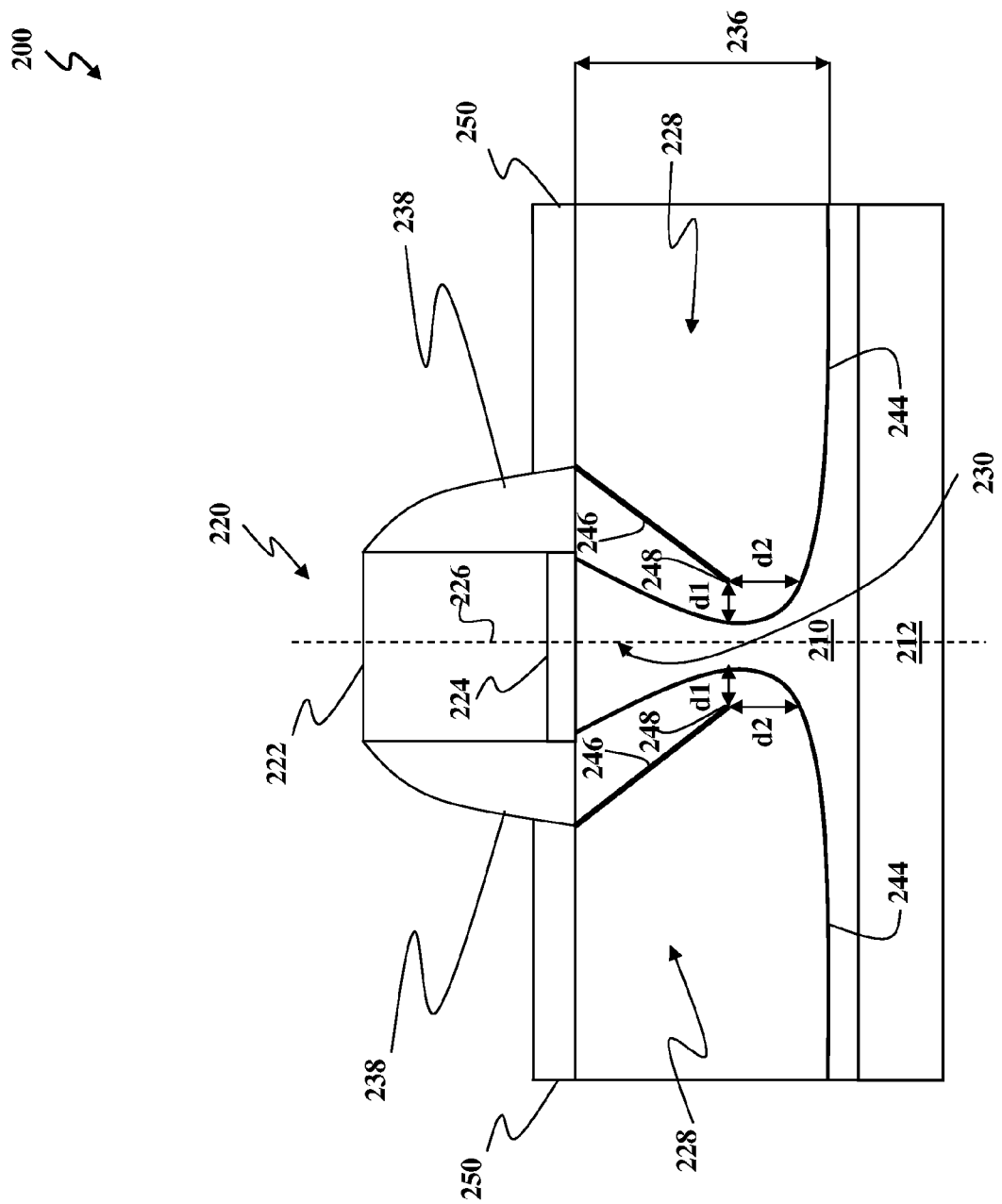

Referring to FIG. 6, the first stress film 240 is removed from the substrate 210. The first stress film 240 may be removed by any suitable process. For example, the first stress film 240 may be removed by a conventional etching process. The conventional etching process may be performed by wet etching using phosphoric acid or hydrofluoric acid, or by dry etching using suitable etchant.

Still referring to FIG. 6, a semiconductor material 250 is deposited over the substrate 210 in the S/D region 228 of the semiconductor device 200. The semiconductor material 250 may be deposited by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the substrate 210. The semiconductor material 250 may include Si, SiP, SiC, SiCP, a combination thereof, or any other suitable semiconductor material.

Figure 7:
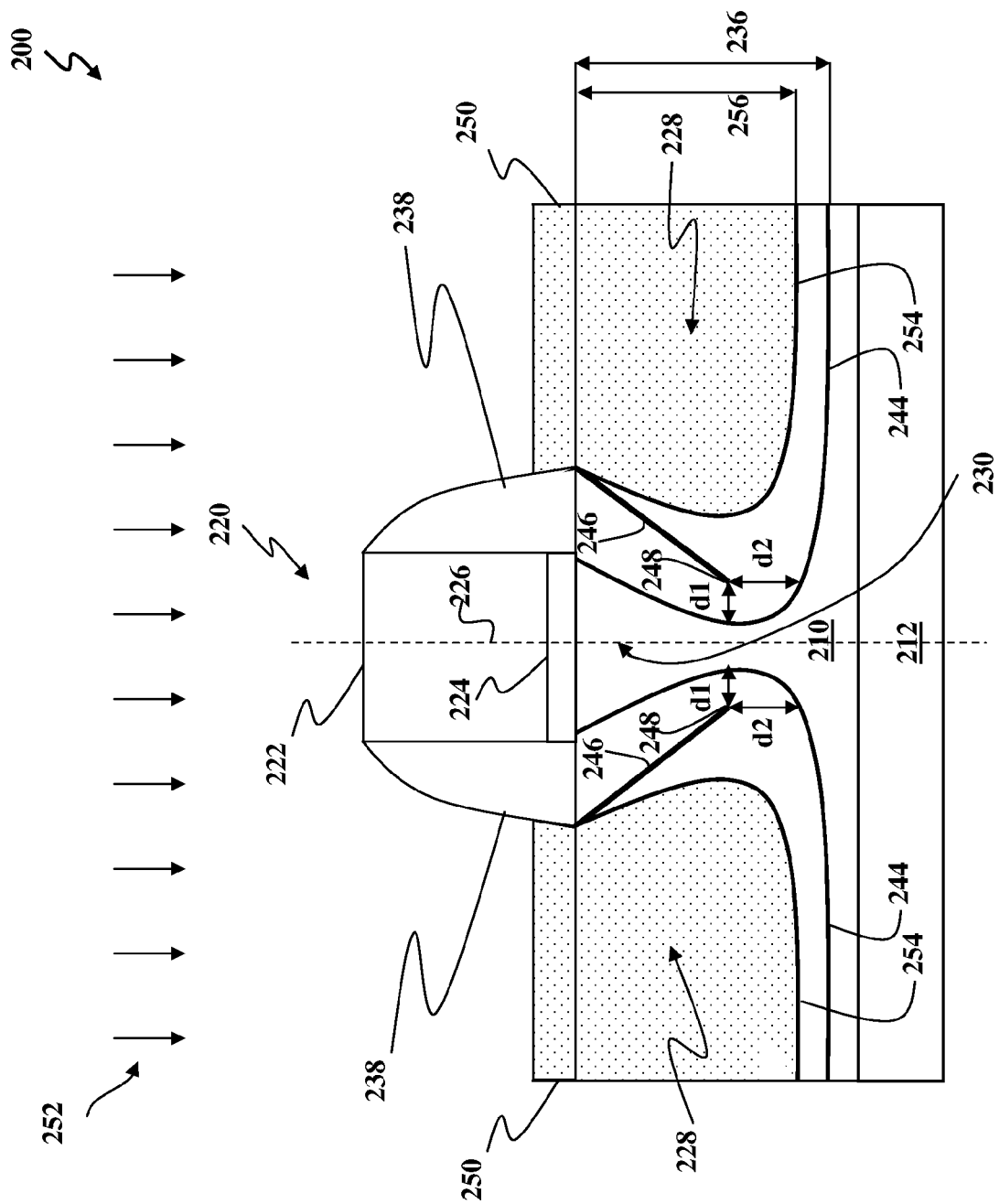

Referring to FIG. 7, a second pre-amorphous implantation (PAI) process 252 is performed on the substrate 210. The second PAI process 252 implants the substrate 210, damaging the lattice structure of the substrate 210 and forming a second amorphized region 254. In the present embodiment, the second amorphized region 254 is formed in the S/D region 228 of the semiconductor device 200 and does not extend beyond the center line 226 of the gate structure 220. Also, the second amorphized region 254 is formed in a portion of the first stressor region 244. The formation of the second amorphized region 254 may partially or completely eliminate the first dislocations 246 that extend within the second amorphized region 254. The second amorphized region 254 has a depth 256. The second amorphized depth 256 is formed according to design specifications. The second amorphized depth 256 may range from about 10 to about 30 nanometers. In the present embodiment, because the substrate 210 is a UTB SOI substrate, the second amorphized depth 256 is less than about 30 nanometers. The second amorphized depth 256 can be controlled by the second PAI process 252 implant energy, implant species, and/or implant dosage.

The second PAI process 252 implants the substrate 210 with silicon (Si) or germanium (Ge). Alternatively, the second PAI process 252 could utilize other implant species, such as Ar, Xe, BF2, As, In, other suitable implant species, or combinations thereof. In the present embodiment, the second PAI process 252 implants Si or Ge at an implant energy from about 10 KeV to about 60 KeV, and a dosage ranging from about 1E14 atoms/cm2 to about 5E15 atoms/cm2, depending on the implantation temperature. Lower implantation temperature will enhance implant amorphization efficiency. The implantation temperature can be any temperature ranging from about −100° C. to about 30° C. For example, the implantation temperature can be room temperature ranging from about 20° C. to about 30° C., or the implantation temperature can be a cryogenic temperature ranging from about −100° C. to about −60° C. The implantation angle can range, for example, from about 0 degrees to about 20 degrees. The implantation angle may be limited by the proximity of adjacent structures that may block/obstruct the second PAI process 252. The second PAI process 252 may include multiple implantation steps, depending on design specifications and the above noted tuning variables. For example, the second PAI process 252 may include a two step process wherein the first step includes utilizing an implantation energy from about 25 KeV to about 40 KeV and a dosage from about 1E14 atoms/cm2 to about 5E15 atoms/cm2, and the second step includes utilizing an implantation energy from about 10 KeV to about 40 KeV and a dosage from about 1E14 atoms/cm2 to about 5E15 atoms/cm2.

A patterned photoresist layer may be utilized to define where the second amorphized region 254 is formed and protect other regions of the semiconductor device 200 from implantation damage. For example, the patterned photoresist layer is patterned such that it exposes the S/D regions 228 to the second PAI process 252 (forming second amorphized region 254) while protecting the gate structure 220 (and other portions of the semiconductor device 200) from the second PAI process 252. Alternatively, a patterned hard mask layer, such as a SiN or SiON layer, is utilized to define the second amorphized region 254. The patterned photoresist layer or the patterned hard mask layer may be part of the current manufacturing process (e.g., LDD or source/drain formation), thereby minimizing cost as no additional photoresist layer or hard mask is required for the second PAI process 252. In the present embodiment, the first PAI process 232 is substantially similar to the second PAI process 252. In alternative embodiments, the first PAI process 232 is different than the second PAI process 252.

Figure 8:
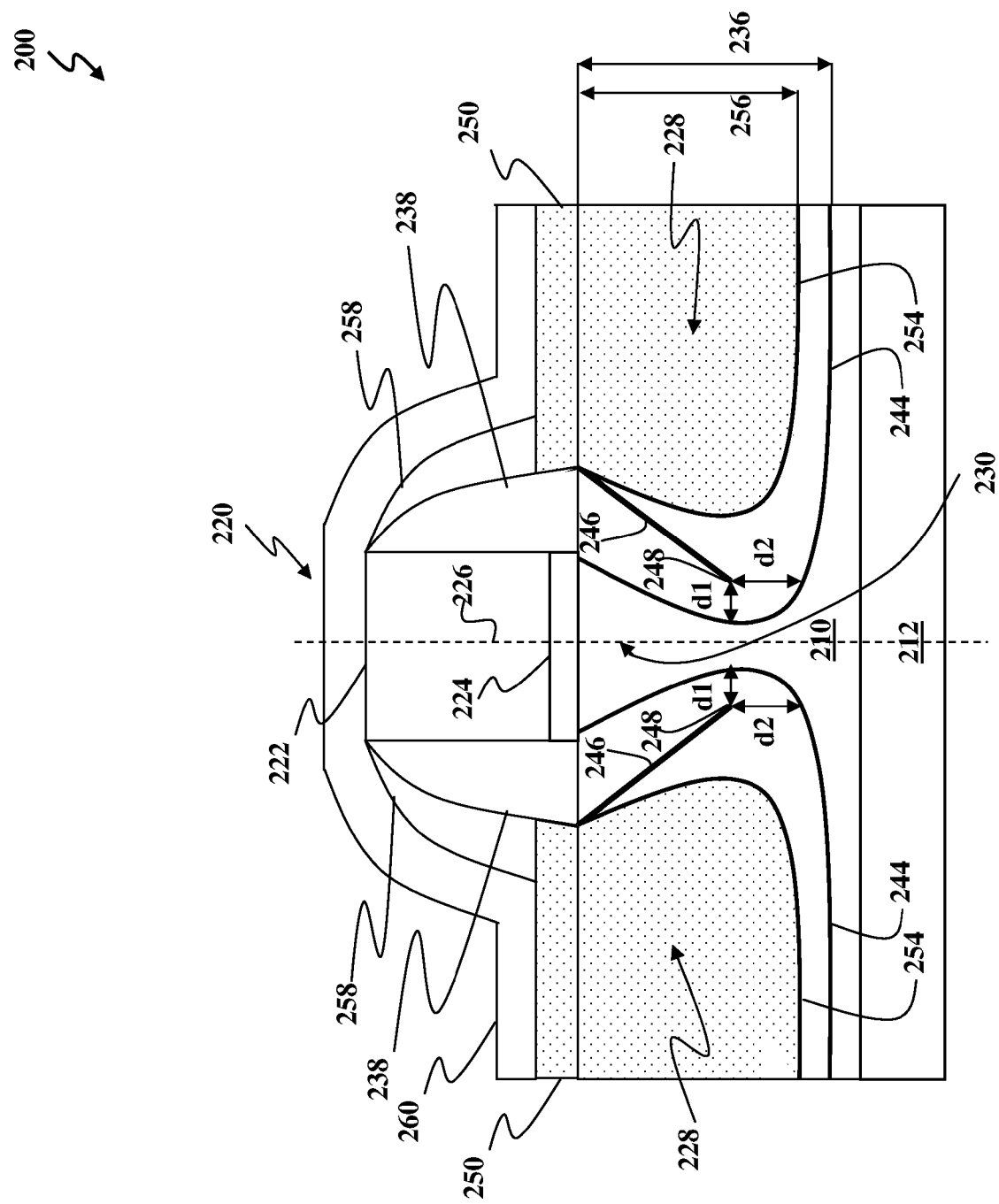

Referring to FIG. 8, second gate spacers 258 are formed on the sidewalls of the first gate spacers 238. The second gate spacers 258 are formed over the epi grown semiconductor material by any suitable process to any suitable thickness. The second gate spacers 258 include a dielectric material, such as silicon nitride, silicon oxide, silicon oxynitride, other suitable materials, and/or combinations thereof. A second stress film 260 is deposited over the substrate 210. The second stress film 260 may be formed by chemical vapor deposition (CVD), physical vapor deposition (PVD), atomic layer deposition (ALD), high density plasma CVD (HDPCVD), plating, other suitable methods, and/or combinations thereof. The second stress film 260 may include a dielectric material, such as silicon nitride, silicon oxide, silicon oxynitride, other suitable materials, and/or combinations thereof. The second stress film 260 is used to provide stress in a subsequent second annealing process 262 which crystallizes the second amorphized region 254.

Figure 9:
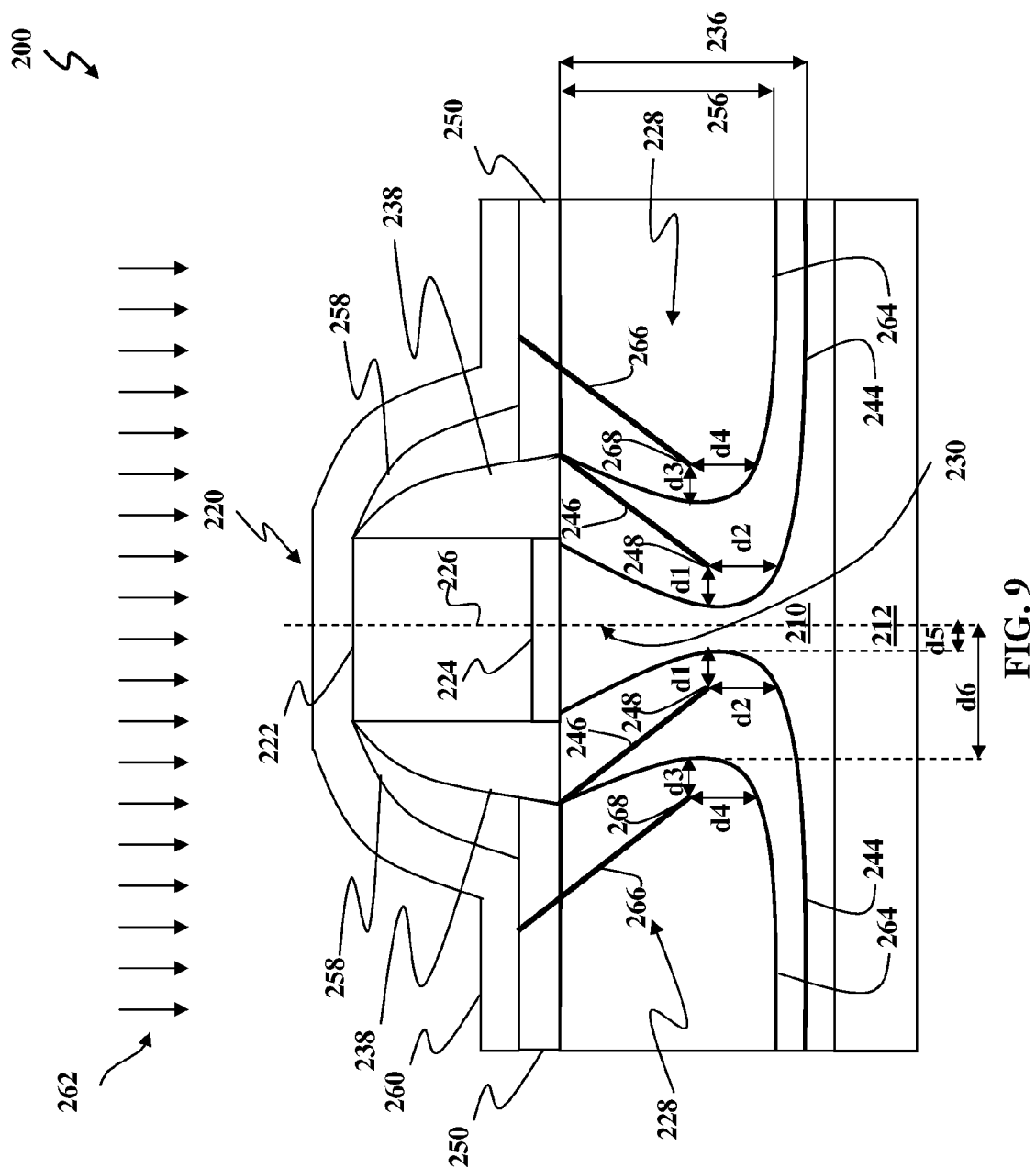

Referring to FIG. 9, a second annealing process 262 is performed on the substrate 210 and the second stress film 260. The second annealing process 262 causes the second amorphized region 254 to crystallize, forming a second stressor region 264. This process is often referred to as solid-phase epitaxy (SPE), and thus, the second stressor region 264 may be referred to as epi regions. The second annealing process 262 is a rapid thermal annealing (RTA) process or a millisecond thermal annealing (MSA) process (for example, a millisecond laser thermal annealing process).

The second annealing process 262 may include a long range pre-heat which minimizes or even eliminates end of range (EOR) defects. The long range pre-heat may be performed at a temperature from about 500° C. to about 800° C. The long range pre-heat may be performed for about 10 to about 300 seconds. The second annealing process 262 may be performed at a temperature from about 500° C. to about 1,400° C. Also, depending on the type of annealing process and the temperature utilized, the second annealing process 262 may be performed for about 1 millisecond to about 300 seconds. In the present embodiment, the second annealing process 262 is a RTA process, utilizing a temperature greater from about 950° C. to about 1050° C. and is performed for about 3 milliseconds to about 5 seconds. In an embodiment, the second annealing process 262 is a MSA process, utilizing a temperature up to a Si melting point of about 1,400° C. and is performed for a few milliseconds or less, for example for about 0.8 milliseconds to about 100 milliseconds. In the present embodiment, the first annealing process 242 is substantially similar to the second annealing process 262. In alternative embodiments, the first annealing process 242 is different than the second annealing process 262.

During the second annealing process 262, as the substrate 210 crystallizes, second dislocations 266 are formed in the second stressor region 264. Also, as the substrate 210 crystallizes, portions of the first dislocations 246 that may extend within the second stressor region 264 reform. In other words, the first dislocations 246 may extend from the first stress region 252 through the second stressor region 264 and reform during the second annealing process 262. The reformation of the first dislocations 246 utilize portions of the first dislocations 246, within the first stressor region 244, as a seed. Accordingly, there are multiple dislocations within the substrate 210. The second dislocations 266 may be, for example, formed in the 111 direction. The 111 direction has an angle of about 45 to about 65 degrees, the angle being measured with respect to an axis parallel to the top surface of the substrate 210. In the present embodiment, the second dislocations 266 have a 111 direction with an angle of about 55 degrees, the angle being measured with respect to an axis parallel to the top surface of the substrate 210. The second dislocations 266 may be formed such that they are substantially parallel to the first dislocations 246. Also, the second dislocations 266 may be formed such that they extend through the epi grown semiconductor material 250.

The second dislocations 266 start formation at second pinchoff points 268. The second pinchoff points 268 are formed in the second stressor region 264 at a depth of about 10 to about 30 nanometers, the depth being measured from the top surface of the substrate 210. The second pinchoff points 268 have a horizontal buffer d3 and a vertical buffer d4. The horizontal buffer d3 and the vertical buffer d4 are formed according to design specifications and are a function of the second annealing process 262. For example, the second pinchoff points 268 have a horizontal buffer d3 of about 1 to about 10 nanometers and a vertical buffer d4 of about 1 to about 20 nanometers. In the present embodiment, the second pinchoff points 268 have a horizontal buffer d3 of about 5 nanometers, a vertical buffer d4 of about 5 nanometers, and are formed at a depth less than about 30 nanometers, the depth being measured from the top surface of the substrate 210. Further, as illustrated, the first stressor region 224 has a first horizontal distance d5 measured from the center line 226 of the gate structure 220 and the second stressor region 264 has a second horizontal distance d6 from the center line 226 of the gate structure 220. The second horizontal distance d6 is greater than the first horizontal distance d5.

Figure 10:
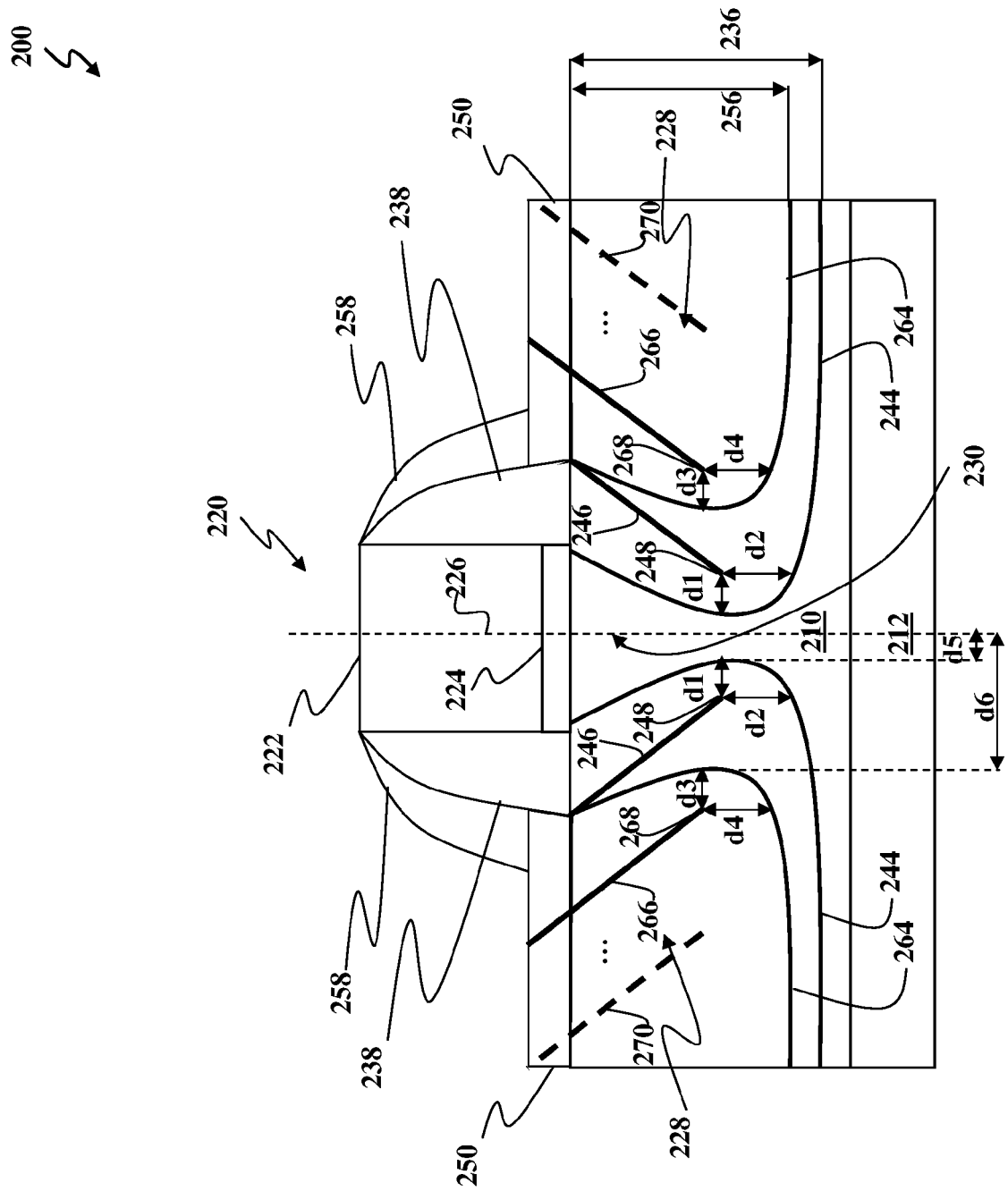

Referring to FIG. 10, the second stress film 260 is removed from the substrate 210. The second stress film 260 may be removed by any suitable process. For example, the second stress film 260 may be removed by a conventional etching process. The conventional etching process may be performed by wet etching using phosphoric acid or hydrofluoric acid, or by dry etching using suitable etchant.

The foregoing embodiment of method 100 may further include additional similar process steps to form additional n-number of stress regions and additional n-number of dislocations 270.

A benefit of forming multiple dislocations (within stress regions), in accordance with the disclosed embodiments, is that the dislocations are able to be formed consistently within the active region (e.g., source/drain) and induce a stress (e.g., tensile stress or compressive stress) in the channel region, thereby improving the carrier mobility in a current flow direction within the channel region. Moreover, the formation of the multiple dislocations, in accordance with the disclosed embodiments, have the added benefit of utilizing the epi grown semiconductor material to induce additional stress in the channel region. An additional benefit is that the method of the disclosed embodiments can be easily implemented in the current manufacturing process. Thus, the disclosed embodiments provide for increasing the stress in the channel region to improve carrier mobility without adding significant cost to the manufacturing process and/or device. It is understood that different embodiments may have different advantages, and that no particular advantage is necessarily required of any embodiment.

The semiconductor device 200 may undergo further MOS technology processing to form various features. For example, the method 100 may proceed to form contact features, such as silicide regions. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 210 and a chemical mechanical polishing (CMP) process is further applied to the substrate to planarize the substrate. Further, a contact etch stop layer (CESL) may be formed on top of the gate structure 220 before forming the ILD layer.

In an embodiment, the gate stack 222 remains polysilicon in the final device. In another embodiment, a gate replacement process (or gate last process) is performed, where the polysilicon gate stack 222 is replaced with a metal gate. For example, a metal gate may replace the gate stack (i.e., polysilicon gate stack) of the gate structure 220. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

Thus, provided is a semiconductor device. The exemplary semiconductor device includes gate structure overlying a top surface of a semiconductor substrate and a first gate spacer disposed on a sidewall of the gate structure and overlying the top surface of the substrate. The semiconductor device further includes a crystallized semiconductor material overlying the top surface of the semiconductor substrate and adjacent to a sidewall of the first gate spacer. The semiconductor device further includes a second gate spacer disposed on the sidewall of the first gate spacer and overlying the crystallized semiconductor material. The semiconductor device further includes a first stressor region disposed in the semiconductor substrate and a second stressor region disposed in the semiconductor substrate and in the crystallized semiconductor material. The first stressor region has a first horizontal distance from a center line of the gate structure and the second stressor region has a second horizontal distance from the center line of the gate structure. The second horizontal distance is greater than the first horizontal distance.

In some embodiments, the semiconductor device further includes a first dislocation disposed in the first stressor region and a second dislocation disposed in the second stressor region. In certain embodiments, the semiconductor device further includes a third stressor region disposed in the semiconductor substrate and in the crystallized semiconductor material and a third dislocation disposed in the third stressor region.

In some embodiments, the first dislocation is completely disposed within the semiconductor substrate, and the second dislocation is disposed within both the semiconductor substrate and the crystallized semiconductor material. In various embodiments, the third dislocation is disposed within both the semiconductor substrate and the crystallized semiconductor material. In certain embodiments, the first stressor region is disposed deeper within the semiconductor substrate than the second stressor region. In further embodiments, the crystallized semiconductor material includes a material selected from the group consisting of Si, SiP, SiC, and SiCP. In some embodiments, the first dislocation extends within a channel region of the semiconductor device, the second dislocation does not extend within the channel region, and the second dislocation is disposed under the first and second gate spacers.

Also provided is an alternative embodiment of a semiconductor device. The exemplary semiconductor device includes a semiconductor substrate having a top surface and a gate structure disposed on the top surface of the semiconductor substrate. The semiconductor device further includes a first gate spacer formed on a sidewall of the gate structure. The semiconductor device further includes a first stress region disposed in the semiconductor substrate and adjacent to a channel region of the semiconductor device, the first stress region including a first dislocation having a first pinchoff point. The semiconductor device further includes a semiconductor material epitaxially (epi) grown on the top surface of the semiconductor substrate in a source and drain region of the semiconductor device, the source and drain region defining the channel region therebetween. The semiconductor device further includes a second gate spacer formed on a sidewall of the first gate spacer and a second stress region disposed in the semiconductor substrate and the epi grown semiconductor material, the second stress region including a second dislocation having a second pinchoff point.

In some embodiments, the second dislocation extends through the semiconductor substrate and the epi grown semiconductor material. In certain embodiments, the semiconductor substrate is an ultra thin body (UTB) silicon on insulator (SOI) semiconductor substrate, the semiconductor substrate and the epi grown semiconductor material include a material selected from the group consisting of silicon (Si) and germanium (Ge), and the first and second dislocations induce a tensile stress in a current flow direction of the channel region. In various embodiments, the first dislocation and the second dislocation are formed in a 111 direction, and wherein the 111 direction has an angle of about 45 to about 65 degrees, the angle being measured with respect to an axis parallel to the top surface of the semiconductor substrate. In further embodiments, the first pinchoff point is disposed in the semiconductor substrate at a depth less than about 30 nanometers, the depth being measured from the top surface of the semiconductor substrate, and the second pinchoff point is disposed in the semiconductor substrate at a depth less than about 30 nanometers, the depth being measured from the top surface of the semiconductor substrate. In some embodiments, the first pinchoff point and the second pinchoff point are not disposed within the channel region. In certain embodiments, the first pinchoff point is disposed in the semiconductor substrate from about −10 nanometers to about 10 nanometers from an edge of the gate structure in a horizontal direction. In various embodiments, the first stress region and the second stress region do not extend beyond a center line of the gate structure. In further embodiments, the first pinchoff point has a depth within the semiconductor substrate that is greater than a depth of the second pinchoff point, the depths being measured from the top surface of the semiconductor substrate Also provided is a method of fabricating a semiconductor device. The exemplary method includes providing a substrate having a gate stack and forming a first gate spacer on a sidewall of the gate stack. The method further includes forming a first stress region disposed in the substrate and adjacent to a channel region of the semiconductor device, the first stress region including a first dislocation. The method further includes epitaxially (epi) growing a semiconductor material on the substrate. The method further includes forming a second gate spacer on a sidewall of the first gate spacer and the epi grown semiconductor material and forming a second stress region disposed in the substrate and the epi grown semiconductor material, the second stress region including a second dislocation.

In some embodiments the method further includes before forming the first gate spacer, performing a first pre-amorphous implantation process on the substrate; and before forming the second gate spacer, performing a second pre-amorphous implantation process on the substrate and the epi grown semiconductor material. Forming the first stress region includes forming a first stress film over the substrate and performing a first annealing process on the substrate and on the first stress film such that the first dislocation is formed. Forming the second stress region includes forming a second stress film over the substrate and performing a second annealing process on the substrate and the second stress film such that the second dislocation is formed. In various embodiments, the first dislocation is formed entirely within the substrate, the second dislocation is formed within both the substrate and the epi grown semiconductor material, and performing the first pre-amorphous implantation process includes implanting the substrate with silicon (Si) or germanium (Ge) implant species and utilizing an implantation energy from about 5 KeV to about 50 KeV and a dosage from about 1E14 atoms/cm$^2$ to about 5E15 atoms/cm$^2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure overlying a top surface of a semiconductor substrate;
   a first gate spacer disposed on a sidewall of the gate structure and overlying the top surface of the substrate;
   a crystallized semiconductor material overlying the top surface of the semiconductor substrate and adjacent to a sidewall of the first gate spacer;
   a second gate spacer disposed on the sidewall of the first gate spacer and overlying the crystallized semiconductor material;
   a first stressor region disposed in the semiconductor substrate;
   a second stressor region disposed in the semiconductor substrate and in the crystallized semiconductor material;
   a first dislocation disposed in the first stressor region; and
   a second dislocation disposed in the second stressor region,
   wherein the first stressor region has a first horizontal distance from a center line of the gate structure and the second stressor region has a second horizontal distance from the center line of the gate structure, the second horizontal distance being greater than the first horizontal distance, and
   wherein the second dislocation is disposed under the first and second gate spacers and within the semiconductor substrate and the crystallized semiconductor material.

2. The semiconductor device of claim 1 further comprising:
   a third stressor region disposed in the semiconductor substrate and in the crystallized semiconductor material; and
   a third dislocation disposed in the third stressor region.

3. A semiconductor device, comprising:
   a gate structure overlying a top surface of a semiconductor substrate;
   a first gate spacer disposed on a sidewall of the gate structure and overlying the top surface of the substrate;

a crystallized semiconductor material overlying the top surface of the semiconductor substrate and adjacent to a sidewall of the first gate spacer;

a second gate spacer disposed on the sidewall of the first gate spacer and overlying the crystallized semiconductor material;

a first stressor region disposed in the semiconductor substrate;

a second stressor region disposed in the semiconductor substrate and in the crystallized semiconductor material;

a first dislocation disposed in the first stressor region; and a second dislocation disposed in the second stressor region, wherein the first dislocation is completely disposed within the semiconductor substrate, and wherein the second dislocation is disposed within both the semiconductor substrate and the crystallized semiconductor material.

4. The semiconductor device of claim 2 wherein the third dislocation is disposed within both the semiconductor substrate and the crystallized semiconductor material.

5. The semiconductor device of claim 1 wherein the first stressor region is disposed deeper within the semiconductor substrate than the second stressor region.

6. The semiconductor device of claim 1 wherein the crystallized semiconductor material includes a material selected from the group consisting of Si, SiP, SiC, and SiCP.

7. The semiconductor device of claim 1 wherein the first dislocation extends within a channel region of the semiconductor device, and wherein the second dislocation does not extend within the channel region.

8. A semiconductor device, comprising:

a semiconductor substrate having a top surface;

a gate structure disposed on the top surface of the semiconductor substrate;

a first gate spacer formed on a sidewall of the gate structure;

a first stress region disposed in the semiconductor substrate and adjacent to a channel region of the semiconductor device, the first stress region including a first dislocation having a first pinchoff point;

a semiconductor material epitaxially (epi) grown on the top surface of the semiconductor substrate in a source and drain region of the semiconductor device, the source and drain region defining the channel region therebetween;

a second gate spacer formed on a sidewall of the first gate spacer; and a second stress region disposed in the semiconductor substrate and the epi grown semiconductor material, the second stress region including a second dislocation having a second pinchoff point, wherein the second dislocation extends through the semiconductor substrate and the epi grown semiconductor material.

9. The semiconductor device of claim 8 wherein the semiconductor substrate is an ultra thin body (UTB) silicon on insulator (SOI) semiconductor substrate, wherein the semiconductor substrate and the epi grown semiconductor material include a material selected from the group consisting of silicon (Si) and germanium (Ge), and wherein the first and second dislocations induce a tensile stress in a current flow direction of the channel region.

10. The semiconductor device of claim 8 wherein the first dislocation and the second dislocation are formed in a 111 direction, and wherein the 111 direction has an angle of about 45 to about 65 degrees, the angle being measured with respect to an axis parallel to the top surface of the semiconductor substrate.

11. The semiconductor device of claim 8 wherein the first pinchoff point is disposed in the semiconductor substrate at a depth less than about 30 nanometers, the depth being measured from the top surface of the semiconductor substrate, and wherein the second pinchoff point is disposed in the semiconductor substrate at a depth less than about 30 nanometers, the depth being measured from the top surface of the semiconductor substrate.

12. The semiconductor device of claim 8 wherein the first pinchoff point and the second pinchoff point are not disposed within the channel region.

13. The semiconductor device of claim 8, wherein the first pinchoff point is disposed in the semiconductor substrate from about −10 nanometers to about 10 nanometers from an edge of the gate structure in a horizontal direction.

14. The semiconductor device of claim 8 wherein the first stress region and the second stress region do not extend beyond a center line of the gate structure.

15. The semiconductor device of claim 8 wherein the first pinchoff point has a depth within the semiconductor substrate that is greater than a depth of the second pinchoff point, the depths being measured from the top surface of the semiconductor substrate.

16. A semiconductor device, comprising:

a gate structure overlying an exposed surface of a semiconductor substrate;

a first gate spacer disposed on a sidewall of the gate structure;

a semiconductor material overlying the exposed surface of the semiconductor substrate and adjacent to a sidewall of the first gate spacer;

a second gate spacer disposed on the sidewall of the first gate spacer;

a first stress region disposed in the semiconductor substrate;

a second stress region disposed in the semiconductor substrate and in the semiconductor material;

a first dislocation disposed in the first stress region; and a second dislocation disposed in the second stress region within the semiconductor substrate and the semiconductor material.

17. The semiconductor device of claim 16 wherein the first dislocation has a first pinchoff point and the second dislocation has a second pinchoff point, wherein the first pinchoff point is disposed in the semiconductor substrate at a depth less than about 30 nanometers, the depth being measured from the top surface of the semiconductor substrate, and wherein the second pinchoff point is disposed in the semiconductor substrate at a depth less than about 30 nanometers, the depth being measured from the top surface of the semiconductor substrate.

18. The semiconductor device of claim 16 wherein the first stress region has a first leading edge and the second stress region has a second leading edge, wherein the first leading edge is at a first horizontal distance from a center line of the gate structure and the second leading edge is at a second horizontal distance from the center line, and wherein the second horizontal distance is greater than the first horizontal distance.

19. The semiconductor device of claim 16 wherein the first stress region is disposed deeper within the semiconductor substrate than the second stress region.

20. The semiconductor device of claim 16 wherein the first dislocation extends within a channel region of the semiconductor device,
   wherein the second dislocation does not extend within the channel region, and
   wherein the second dislocation is disposed under the first and second gate spacers.

* * * * *